United States Patent
Long et al.

(10) Patent No.: US 11,693,035 B2
(45) Date of Patent: Jul. 4, 2023

(54) SENSING ELECTRICAL CHARACTERISTICS VIA A RELAY COIL

(71) Applicant: ABL IP Holding LLC, Atlanta, GA (US)

(72) Inventors: David J. Long, Visalia, CA (US); Miroslaw Grotkowski, Jackson, GA (US); Richard Lee Westrick, Jr., Social Circle, GA (US)

(73) Assignee: ABL IP Holding LLC, Atlanta, GA (US)

( * ) Notice: Subject to any disclaimer, the term of this patent is extended or adjusted under 35 U.S.C. 154(b) by 362 days.

(21) Appl. No.: 16/989,216

(22) Filed: Aug. 10, 2020

(65) Prior Publication Data

US 2022/0043037 A1    Feb. 10, 2022

(51) Int. Cl.
| | |
|---|---|
| *G01R 19/25* | (2006.01) |
| *G01R 15/18* | (2006.01) |
| *H01H 47/00* | (2006.01) |
| *H01H 47/22* | (2006.01) |
| *G01R 19/257* | (2006.01) |

(52) U.S. Cl.
CPC ....... *G01R 19/2513* (2013.01); *G01R 15/181* (2013.01); *G01R 19/257* (2013.01); *H01H 47/002* (2013.01); *H01H 47/22* (2013.01)

(58) Field of Classification Search
CPC .... H05B 47/115; H05B 39/088; H05B 47/19; H05B 47/13; H04W 4/80; G08C 19/16; H02J 50/80; H02J 50/10; H04B 5/0093; H04B 5/0037
See application file for complete search history.

(56) References Cited

U.S. PATENT DOCUMENTS

| | | | |
|---|---|---|---|
| 7,212,090 B2 | 5/2007 | Kadah | |
| 8,975,787 B2 * | 3/2015 | Bodo | G01R 15/142 |
| | | | 307/126 |
| 2001/0026428 A1 | 10/2001 | Polese et al. | |
| 2005/0018371 A1 * | 1/2005 | Mladenik | H02H 3/00 |
| | | | 361/78 |

(Continued)

FOREIGN PATENT DOCUMENTS

| | | |
|---|---|---|
| EP | 2826053 | 12/2017 |
| ES | 293498 | 12/1987 |

*Primary Examiner* — Jared Fureman
*Assistant Examiner* — Esayas G Yeshaw
(74) *Attorney, Agent, or Firm* — Kilpatrick Townsend & Stockton LLP

(57) ABSTRACT

A current sense system may include a relay, a load conductor, and an integrator sub-circuit. Current may be provided to an electrical load via the load conductor and a latch of the relay. The current carried via the load conductor may induce a sense voltage in a coil of the relay. Based on the sense voltage induced in the relay coil, the integrator sub-circuit may determine a load sense voltage that indicates a level of the current carried via the load conductor. In some implementations, a current indication module may provide an indicator signal based on the load sense voltage. In addition, the indicator signal may be provided to additional components or devices, such as a relay controller configured to activate the latch. In some implementations, the relay controller may be configured to open the latch based on the current level described by the indicator signal.

20 Claims, 5 Drawing Sheets

(56) References Cited

U.S. PATENT DOCUMENTS

| | | | | |
|---|---|---|---|---|
| 2015/0309105 A1* | 10/2015 | Ostrovsky | .............. | H02H 3/335 |
| | | | | 324/509 |
| 2017/0150580 A1* | 5/2017 | Mix | ....................... | H05B 47/16 |

* cited by examiner

Figure 3  Current Sense System 300

SENSING ELECTRICAL CHARACTERISTICS VIA A RELAY COIL

TECHNICAL FIELD

This disclosure relates generally to the field of electrical sensors and more specifically relates to sensing electrical characteristics of an electrical load.

BACKGROUND

Electrical sense circuits may determine information about characteristics of an electrical load. For instance, an electrical sense circuit may determine characteristics of current, voltage, power, or other electrical resources that are consumed by the load. In some cases, data provided by the electrical sense circuit can be used to determine operating characteristics of the load, such as efficiency, safety parameters, component failure, or other characteristics describing performance of the device.

Contemporary techniques to sense electrical characteristics may include adding additional components to an electrical circuit in a device. However, including the additional components can increase the manufacturing cost and complexity of the circuit, leading to increased cost of the device. In addition, including the additional components can decrease reliability of the circuit, and can result in increased failure rates for the device. It is desirable to develop electrical sense circuit topologies and techniques that can accurately sense electrical characteristics while decreasing cost and improving reliability of a device that includes the electrical sense circuit.

SUMMARY

According to certain implementations, a current sense system may include a relay, a load conductor, and an integrator sub-circuit. The relay may include a latch and a coil. The latch may be capable of connecting to a power source via an input of the latch and to an electrical load via an output of the latch. The latch may be configured to provide a current to the electrical load from the power source. The load conductor may be connected to the output of the latch and the power input of the electrical load. The current provided to the electrical load, via the latch, may be carried via the load conductor. The load conductor may be located in proximity to the coil, such that the current carried via the load conductor induces a sense voltage in the coil. The integrator sub-circuit may have a first connection to an output of the coil and a second connection to an input of the coil. The coil may be configured for an activation state. In the activation state, the latch may transition between an open state and closed state responsive to an activation signal received by the coil. The coil may be further configured for a sensing state. In the sensing state, the latch may be closed and current may be provided to the electrical load via the latch and via the load conductor. In addition, during the sensing state, the integrator sub-circuit may provide a load sense signal. The load sense signal may be based on a comparison of the sense voltage and a reference voltage. The sense voltage may be received by the first connection of the integrator sub-circuit. The reference voltage may be received via the second connection of the integrator sub-circuit.

According to certain implementations, a current sense system may include a relay, a load conductor, and a current indication module. The relay may include a latch and a coil. The latch may be capable of connecting to a power source via an input of the latch and an electrical load via an output of the latch. The latch may be configured to provide a current to the electrical load from the power source. The load conductor may be connected to the latch. The current provided to the electrical load, via the latch, may be carried via the load conductor. The load conductor may be located in proximity to the coil, such that the current carried via the load conductor induces a sense voltage in the coil. The current indication module may have a load sense input that is connected to an output of the coil. During an activation state, the relay may activate the latch responsive to an activation signal received by the coil. In the activation state, the latch may transition between an open state and a closed state responsive to the activation signal. During a sensing state, the current indication module may receive a load sense signal via the load sense input. The load sense signal may be based on the sense voltage induced in the coil. In addition, during the sensing state, the current indication module may determine a level of current received by the electrical load. The level of current may be based on the load sense signal. In addition, during the sensing state, the current indication module may provide an indicator signal based on the determined level of current.

These illustrative implementations are mentioned not to limit or define the disclosure, but to provide examples to aid understanding thereof. Additional implementations are discussed in the Detailed Description, and further description is provided there.

BRIEF DESCRIPTION OF THE DRAWINGS

Features, implementations, and advantages of the present disclosure are better understood when the following Detailed Description is read with reference to the accompanying drawings, where.

DETAILED DESCRIPTION

Figure 1:
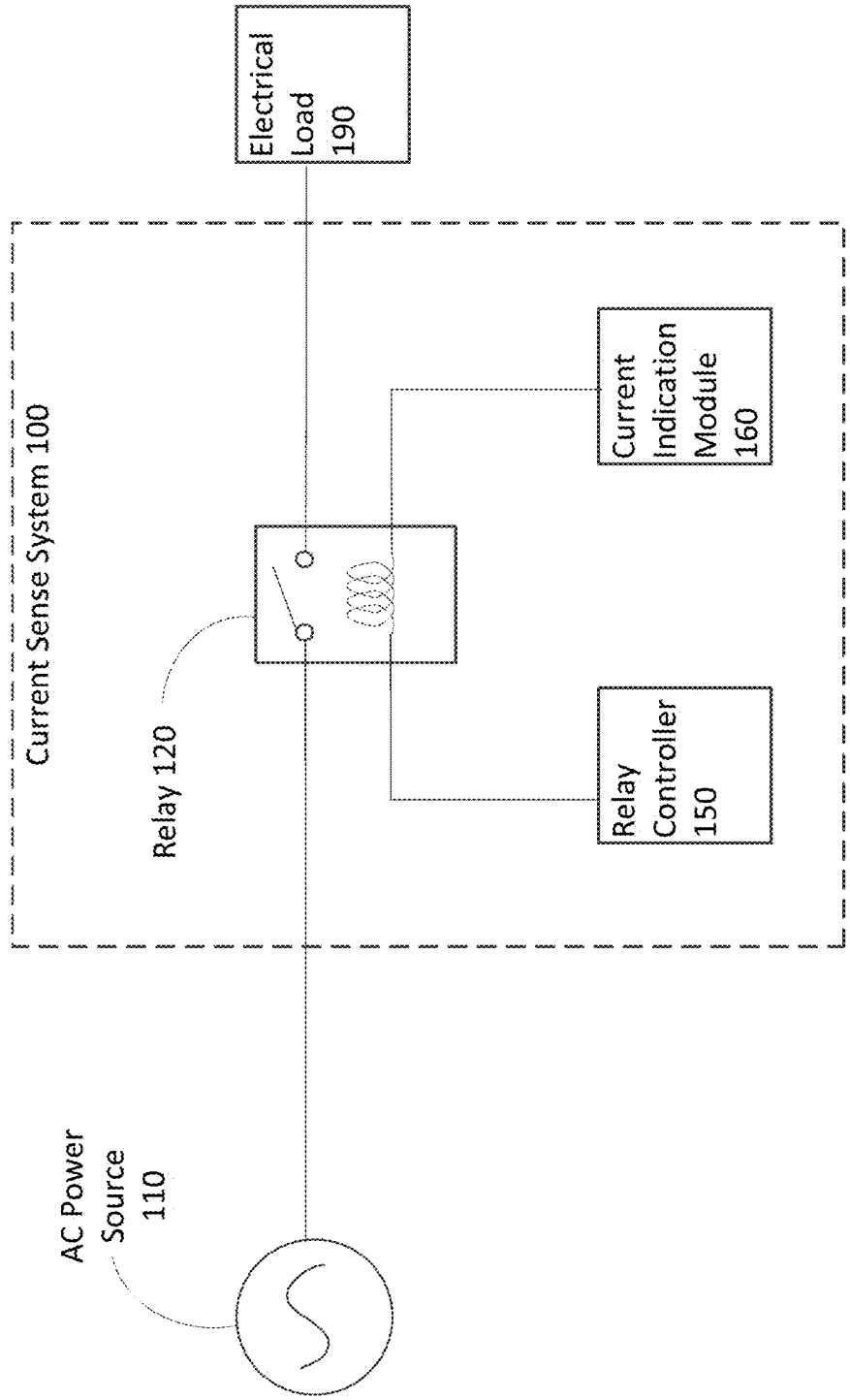
FIG. 1 is a diagram depicting an example of a current sense system that may include a relay, according to certain implementations.

As discussed above, prior techniques for sensing electrical characteristics may include adding sensing components to an electrical circuit. For example, a contemporary electrical sense circuit may include one or more of a Hall effect sensor, a current sense resistor, a current sense transformer, a power monitor integrated circuit ("IC"), or other sensing components that provide information about electrical characteristics. The sensing components may be additional components included in a circuit that provides current, voltage, and/or power to an electrical load. In some cases, including the additional components for sensing can increase manufacturing complexity or cost of the circuit (or a device that includes the circuit). In addition, including the additional components for sensing can decrease reliability of the circuit. For instance, the additional sensing components can increase failure rates by increasing the number of circuit components that might break or malfunction. Furthermore, some types of sensing components have increased sensitivity to power quality and may be more likely to fail if the circuit experiences voltage transients (e.g., power surges, power spikes) or other power variations, further decreasing reliability of the circuit.

Certain implementations described herein provide for a system for sensing electrical characteristics, such as a current sense system. The sensing system may be configured to sense electrical characteristics, such as current, voltage, or power, of electricity that is provided to an electrical load via the sensing system. In addition, the sensing system may be configured to sense the electrical characteristics utilizing one or more components that transmit the electricity to the electrical load, such as a relay. The relay may be configured to transmit electricity via a relay latch while sensing characteristics of the transmitted electricity via a relay coil.

In some implementations, a current sense system includes a relay that is configured to sense electrical characteristics of a current that is transmitted via the relay. While a latch of the relay is closed, the relay may be configured to transmit the electricity via at least one load conductor. In addition, the load conductor may be arranged within inductive proximity to a coil of the relay, such that a sense voltage is induced in the coil based on the transmitted electricity. An integrator in the current sense system may compare the induced sense voltage to a reference voltage. The integrator may generate a load sense signal based on the comparison. A current sense module may receive the load sense signal and generate an indicator signal that describes a level of the current that is transmitted via the relay.

In some implementations, a system for sensing electrical characteristics may provide information describing one electrical characteristic or multiple electrical characteristics. For convenience, and not by way of limitation, the sensing systems and techniques described herein may be referred to as current sensing, such as "current sense systems," "current sense techniques," or other comparable terms. However, it is to be understood that the described systems and techniques may also provide information that can be used to determine one or more of voltage, power, or other electrical characteristics in addition to or instead of current.

Referring now to the drawings, FIG. 1 is a diagram depicting an example of a current sense system 100. The current sense system 100 may include a relay 120 that is configured to provide current sense information. In addition, the current sense system 100 may include or be configured to connect to one or more of an alternating current ("AC") power source 110 or an electrical load 190. In some cases, the AC power source 110 may be a remote power source, such as power delivered via an electrical distribution system (e.g., power grid). In addition, the AC power source 110 may be a local source of power, such as a generator, a transformer, or any other device (or combination of devices) capable of providing AC power.

In some implementations, the current sense system 100 includes one or more electrical circuits that are configured to provide power from the AC power source 110 to the electrical load 190. The electrical load 190 may include a particular electrically-powered device, such as a light, a motor, or another suitable device. In addition, the electrical load 190 may include a combination of electrically-powered devices, such as a dimmer combined with a light, or another suitable combination of devices. FIG. 1 depicts the electrical load 190 and AC power source 110 as separate from the current sense system 100, but other configurations are possible. For example, a particular device or device component may include a current sense system that is included with an electrical load and/or a power source, such as a printed circuit board that includes components for a current sense system, an electrical load, and power supply circuitry.

In FIG. 1, the current sense system 100 may provide power from the AC power source 110 to the electrical load 190 via the relay 120. For example, the relay 120 may include a latch and a coil, each having one or more electrical connections (e.g., pins, sockets, blades). The latch may be capable of connecting to the AC power source 110 via a first connection, and to the electrical load 190 via a second connection. In addition, the current sense system 100 may include a relay controller 150 that is capable of providing one or more control signals to the coil of the relay 120. Responsive to a control signal received from the relay controller 150, the coil may activate the latch, such as an activation that transitions the latch between an open state and a closed state. While in the closed state, the latch of the relay 120 may provide power to the electrical load 190, such as by completing an electrical connection between the AC power source 110 and the electrical load 190. While in an open state, the latch of the relay 120 may interrupt power to the electrical load 190, such as by interrupting the electrical connection between the AC power source 110 and the electrical load 190.

FIG. 1 depicts the relay 120 as a single-pole/single-throw relay having one latch and one coil, but other configurations are possible. For example, a current sense system may include one or more relays that are single-pole, double- or multi-pole, single-throw, double- or multi-throw, or other suitable configurations of relays. In some implementations, a current sense system may include a relay that is mechanically latching. For example, the relay 120 may be a latching relay. In some cases, a current sense system may include one or more additional types of relays, such as a normally open (e.g., NO relay) or normally closed (e.g., NC relay) types of relays. For example, a current sense system could include an electrically-held normally closed relay that is configured to transmit power (e.g., from an AC power source to electrical load) while the electrically-held latch is closed.

In some implementations, the relay 120 is configured to provide multiple functions within the current sense system 100. For example, the relay 120 may be configured as a multi-function relay that provides current sense information while providing current to the electrical load 190. In some cases, the current sense system 100 may include a current indication module 160. In addition, the current indication module 160 may be configured to receive one or more electrical signals from the coil of the relay 120. For example, the coil in the relay 120 may provide one or more of a sense current or a sense voltage to the current indication module 160. The sense current or sense voltage may be induced in the coil by a load current carried via the latch, such as a load current provided to the electrical load 190 from the AC power source 110.

In some cases, the current indication module 160 may generate a load sense signal based on the electrical signals from the coil, such as the sense current or sense voltage. The load sense signal may indicate a level of the load current (or other electrical characteristic) that is being carried via the latch of the relay 120. In some implementations, the current indication module 160 may provide the load sense signal to one or more additional components or devices, such as to the relay controller 150, the electrical load 190, or another suitable component or device. The additional components or devices may perform one or more operations based on the load sense signal. For example, responsive to receiving the load sense signal (or another indication based on the load sense signal), the relay controller 150 may provide a control signal to the coil, such as an activation control signal to transition the latch from a closed state to an open state (e.g., interrupting power flow to the electrical load 190). In addition, the current indication module 160 may provide the load sense signal to an additional device, such as a security control panel for a building, a programmable heating/cooling system, an intelligent electrical meter, or another type of device that is configured to receive information about electrical consumption.

FIG. 1 depicts the relay controller 150 and the current indication module 160 as separate, but other configurations are possible. For example, a current sense system could include a particular microcontroller (or group of microcontrollers) that implements a relay controller and a current indication module.

Figure 2:
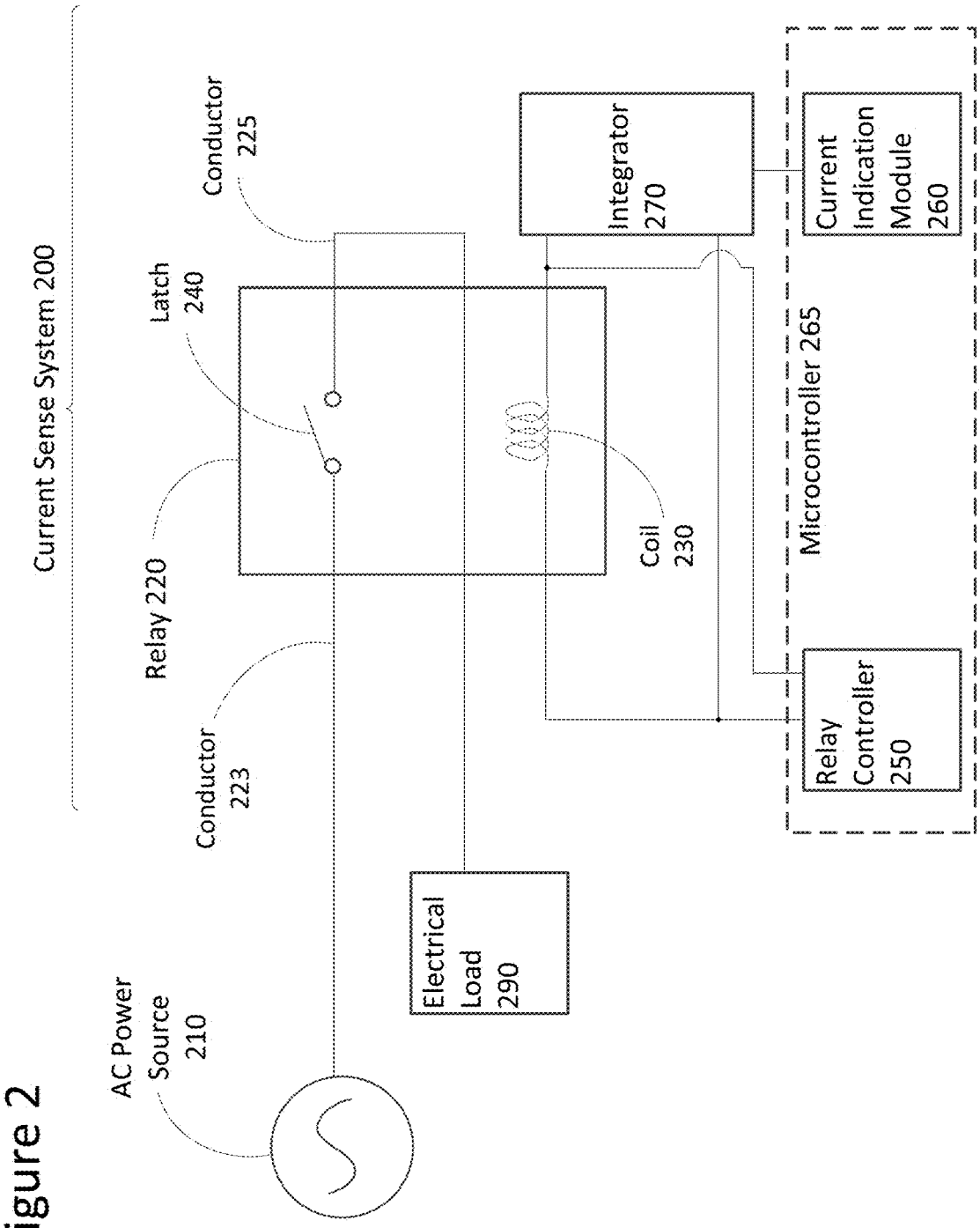
FIG. 2 is a diagram depicting an example of a current sense system in which a load conductor may be located in proximity to a relay configured to provide current sense information, according to certain implementations.

In some implementations, a current sense system may include one or more load conductors, such as a wire, an electrical trace (e.g., on a printed circuit board), or an additional type of conductor that is capable of transmitting electricity. The load conductor may be configured to carry current, such as from a power source to an electrical load. In addition, the load conductor may be located in proximity to a coil of a relay that is included in the current sense system. FIG. 2 is a diagram depicting an example of a current sense system 200 in which one or more load conductors may be located in proximity to a relay 220 of the current sense system 200. In the current sense system 200, the relay 220 may include a latch 240 and a coil 230. In addition, the current sense system 200 may include one or more load conductors, such as a load conductor 223 and a load conductor 225, that are electrically connected to the latch 240. For example, the load conductor 223 may be electrically connected (or configured to electrically connect) to an input of the latch 240 and to an AC power source 210. In addition, the load conductor 225 may be electrically connected (or configured to electrically connect) to an output of the latch 240 and to an electrical load 290. The current sense system 200 may be configured to provide electrical power from the AC power source 210 to the electrical load 290. For example, when the latch 240 is in a closed state, current may be transmitted from the AC power source 210 to the electrical load 290 via the conductors 223 and 225.

In some implementations, one or more of the load conductors 223 or 225 may be located in proximity to the coil 230, such that current (or other electrical characteristics) carried by the conductors 223 or 225 may induce a load sense signal in the coil 230. For example, current carried in the conductor 225 may induce a load sense voltage in the coil 230. FIG. 2 depicts the conductor 225, connected to the output of the latch 240 and the electrical load 290, as being located in proximity to the coil 230, but other implementations are possible. For example, a current sense system may be configured such that a load conductor connected to an input of a relay latch and a power source (e.g., conductor 223) is located in proximity to a relay coil. In some cases, a load conductor could be arranged in proximity to one or more relay coils, including a load conductor that is connected to a latch of a first relay and arranged in proximity to a coil of a second relay. In some cases, multiple load conductors could be arranged in proximity to a particular relay coil, such as multiple load conductors transmitting electricity to multiple electrical loads. In some implementations, multiple load conductors may be arranged such that a direction of current, relative to an AC power source, is uniform across the multiple load conductors. For example, a current sense system may include multiple load conductors in proximity to a relay coil arranged such that current carried from a power source to one or more electrical loads flows in a particular direction relative to the power source and electrical loads. In some cases, arranging multiple load conductors to carry current in a particular direction may reduce interference among load conductors, such as interference resulting from current flowing in different (e.g., opposing) directions relative to the relay coil.

The current sense system 200 may include one or more integrator sub-circuits, such as an integrator 270. The integrator 270 may include multiple inputs, such as a first input that is electrically connected to an output of the coil 230 and a second input that is electrically connected to an input of the coil 230. In some cases, the integrator 270 may receive the load sense voltage induced in the coil 230, such as via the first input connected to the output of the coil 230. In addition, the integrator 270 may receive an additional signal, such as a reference voltage, via the second input connected to the input of the coil 230. FIG. 2 depicts the integrator 270 as receiving the additional signal from the relay controller 250, but other implementations are possible. For example, an integrator in a current sense system may receive a reference voltage from a digital ground. FIG. 2 depicts the current sense system 200 as including the integrator 270, but other implementations are possible. For example, a current sense system may omit an integrator sub-circuit. In addition, the example current sense system may include or omit an integrator sub-circuit based on a type of electrical load (e.g., the electrical load 290) of the current sense system. For example, a current sense system may include an integrator sub-circuit when the load is capable of modifying a waveform of power received from a power source (e.g., the AC power source 210), such as a load including a phase-cut dimmer. In addition, a current sense system may omit an integrator sub-circuit when the load does not modify a waveform of received power, such as load including digital electronics.

In some cases, the integrator 270 may provide an output signal based on electrical signals received at the first and second inputs. For example, the integrator 270 may provide a load sense signal that is based on a comparison of the load sense voltage and the reference voltage. In some cases, the integrator 270 may generate the load sense signal based on a difference, or another suitable comparison, between the load sense voltage and the reference voltage. In addition, the load sense signal generated by the integrator 270 may indicate a voltage difference across the coil 230, such as a voltage change induced by current carried via the load conductor 225. FIG. 2 depicts the current sense system 200 as including the integrator 270, but one or more additional types of sub-circuits may be included. For example, the current sense system 200 could include an amplifier sub-circuit, such as to modify a strength of an electrical signal received by (or output by) the integrator 270. In addition, the current sense system 200 could include a filter sub-circuit, such as to reduce or eliminate additional electrical signals (e.g., other than current carried on the conductor 225) that may be received by (or output by) the integrator 270.

In some implementations, the current sense system 200 includes a current indication module 260. The current indication module 260 may receive one or more load sense signals generated by the integrator 270, such as via a load sense input of the current indication module 260. Based on the one or more load sense signals, the current indication module 260 may generate an indicator signal, such as a signal that indicates one or more electrical characteristics of electrical signals present in the coil 230 or the conductor 225. The indicator signal may describe one or more of, for example, a value of the voltage difference across the coil 230, a level of current carried via the conductor 225 (e.g., current received via the electrical load 290), or any other suitable electrical characteristic. In some cases, the indicator signal may include digital data (e.g., a binary value) describing one or more electrical signals present in the coil 230 or the conductor 225, such as a data value indicating whether the current carried via the conductor 225 has exceeded a threshold level of current. For example, the current indication module 260 (or another component of the system 200) may include an analog-to-digital convertor configured to generate a digital output voltage that corresponds to the load sense signal. In addition, the indicator signal may be based on the generated digital output voltage.

In FIG. 2, the current indication module 260 is described as generating an indicator signal based on a load sense signal received from the integrator 270, but other implementations are possible. For example, a current indication module could receive a load sense voltage and a reference voltage (or other electrical signals) from a relay coil, such as in a current sense system that omits an integrator sub-circuit. In addition, the example current indication module could generate one or more of a load sense signal or an indicator signal based on the received load sense voltage and reference voltage.

In some implementations, the current indication module 260 may provide the indicator signal to one or more additional components or devices. For example, the current sense system 200 may include a relay controller 250 that is configured to provide one or more control signals to the relay 220. The current indication module 260 may provide the indicator signal to the relay controller 250. In addition, the relay controller 250 may perform one or more operations based on the received indicator signal, such as providing a control signal to the coil 230. Responsive to the control signal from the relay controller 250, the coil 230 may activate the latch 240, such as to transition the latch 240 from a closed state to an open state. In some cases, the relay controller 250 may be connected to the output of the coil 230.

The current sense system 200 may include a microcontroller, such as a microcontroller 265, that includes each of the current indication module 260 and the relay controller 250. For example, and not by way of limitation, the microcontroller 265 may be a programmable microcontroller that is configured to provide relay control functions and also current indication functions. In addition, the microcontroller 265 may include one or more inputs configured to receive one or more electrical signals in the current sense system 200. For instance, the microcontroller 265 may include a load sense input that may receive the load sense signal from the integrator 270. In addition, the microcontroller 265 may include a reference input that may receive the reference voltage present at the input of the coil 230. In some cases, the microcontroller 265 may include an analog-to-digital convertor (e.g., described above in regards to the current indication module 260) that is configured to generate a digital output voltage corresponding to the load sense signal.

FIG. 2 describes the relay controller 250 and current indication module 260 as being included in the microcontroller 265, but other implementations are possible. For example, a current sense system could include one or more components configured to control the relay, such as a transistor arranged to provide a control signal. In addition, a current sense system could include one or more components configured to provide a signal indicating a level of induced current, such as a comparator sub-circuit arranged to provide an indicator signal.

In some implementations, the current sense system 200 may have one or more operational states, such as a sensing state or an activation state. During the sensing state, for example, the current sense system 200 may be configured to provide electrical power from the AC power source 210 to the electrical load 290. In addition, during the sensing state, the current sense system 200 may be configured to sense a level of the provided electrical power. For example, during the sensing state, the latch 240 (e.g., in a closed state) may transmit current to the load conductor 225 and the integrator 270 may receive the load sense voltage induced in the coil 230 by the current carried via the conductor 225. During the activation state, for example, the current sense system 200 may modify a configuration of one or more components included in the current sense system 200. For example, during the activation state, the current sense system 200 may modify a state of the latch 240, such as providing a control signal from the relay controller 250 to open or close the latch 240. In addition, during the activation state, the current indication module 260 may modify the indicator signal to indicate that load sense information is not available. For instance, while a control signal is provided to the relay 220, the integrator 270 may receive input signals that are based on the control signal (e.g., rather than an induced voltage in the coil 230).

In some cases, the activation state may include a stabilization period, such as a period of time (e.g., about 100 ms) subsequent to a control signal being provided from the relay controller 250. In some cases, the current indication module 260 indicates that load sense information is not available during the stabilization period, such as while the coil 230 is activated by the control signal and the latch 240 completes a transition between an open or closed state. For example, the current indication module 260 may provide an output signal having a value of NULL, an "out of service" value, or another value indicating the activation state. In some implementations, an output from the current indication module 260 during the activation state and stabilization period may be omitted or discarded by a system that receives one or more of the load sense signal or the indication signal. For example, a system that is configured to determine a cumulative measurement of sensed current in the relay 220 may omit or discard output from the current indication module 260 during the activation state.

In some implementations, one or more load conductors included in a current sense system may be located in proximity to a relay or a coil of a relay. In some cases, the load conductor is located within a region of inductive proximity to the relay coil. For example, a region of inductive proximity may include a region surrounding an electrical conductor (e.g., a load conductor, a relay coil), such that electrical signals carried by the conductor induce additional electrical signals in one or more additional electrical conductors that are located within the region of inductive proximity. For example, one or more of a relay coil or a load conductor may each have a region of inductive proximity, such that the relay coil (or the load conductor) may have an induced current based on an electrical signal carried by the load conductor (or the relay coil). In some cases, an electrical conductor may have an inductive proximity region in a three-dimensional region surrounding the conductor. In addition, the inductive proximity region may be sized (e.g., diameter, volume) based on a strength of the electrical signals carried via the conductor.

Figure 3:
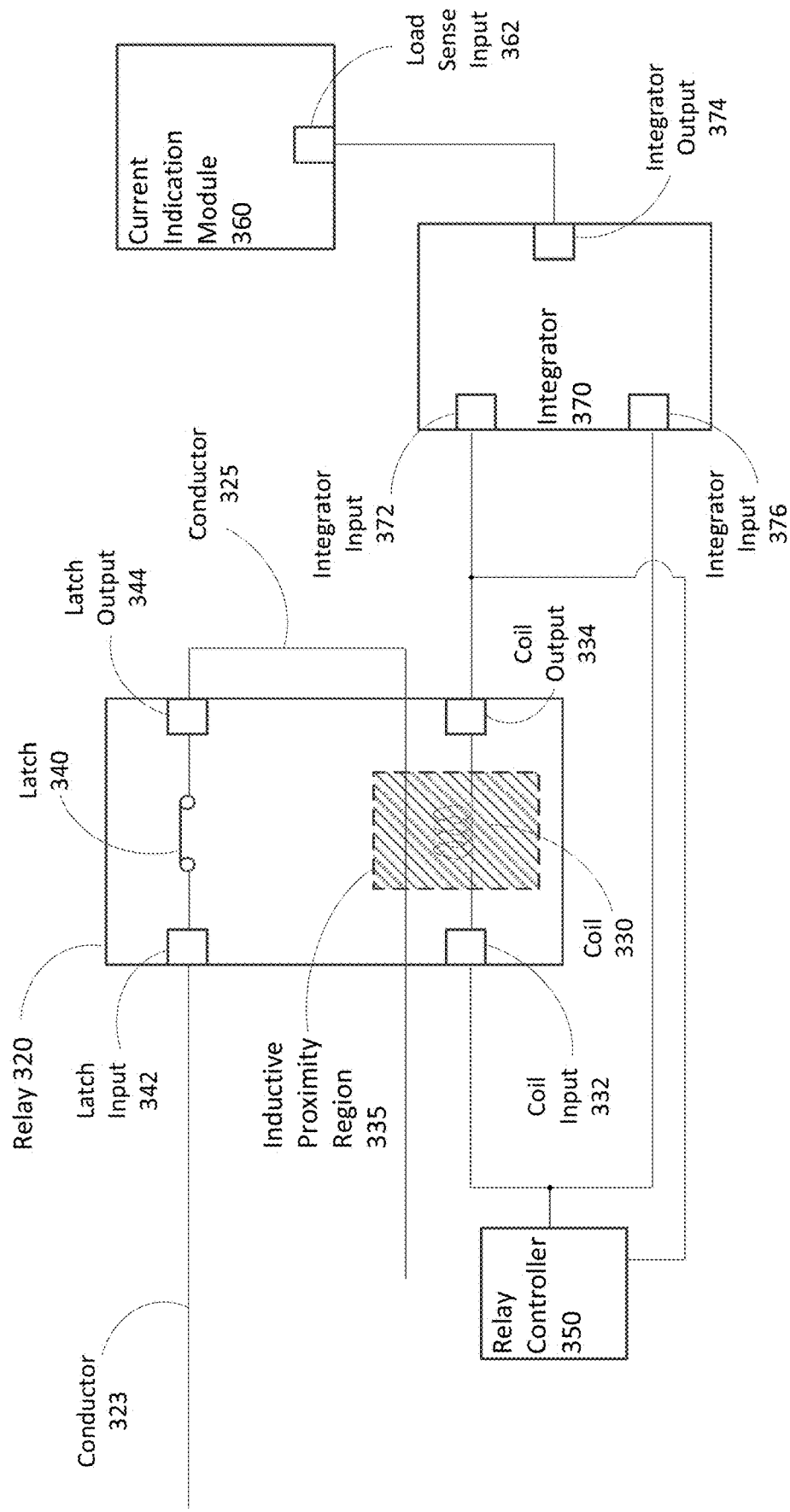
FIG. 3 is a diagram depicting an example of an inductive proximity region of a relay included in a current sense system, according to certain implementations.

FIG. 3 is a diagram depicting an example of a current sense system 300 in which one or more load conductors are located within inductive proximity to a relay 320. In the current sense system 300, the relay 320 may include a latch 340 and a coil 330. A load conductor 323 may be connected to the latch 340 via a latch input 342. In addition, a load conductor 325 may be connected to the latch via a latch output 344. In some cases, the conductor 323 may be connected to a power source and the conductor 325 may be connected to a power input of an electrical load such that, when the latch 340 is in a closed state, electrical power may be transmitted from the power source to the electrical load via the latch 340 and the conductors 323 and 325.

In some implementations, the current sense system 300 may include one or more of a relay controller 350, an integrator 370, or a current indication module 360. The relay controller 350 may be connected to the coil 330 via a coil input 332. In some cases, the relay controller 350 may be configured to control the relay 320, such as by providing one or more control signals via the coil input 332. In addition, the coil 330 may have a coil output 334. In some cases, the coil output 334 may be connected to the relay controller 350. In addition, the coil output 334 may be connected to a first integrator input 372 of the integrator 370. The integrator 370 may have a second integrator input 376 that is connected to the coil input 332. The integrator 370 may have an integrator output 374 that is connected to a load sense input 362 of the current indication module 360.

In some implementations, one or more of the load conductors 323 or 325 are located in inductive proximity to the coil 330. For example, the conductor 325 may be located within an inductive proximity region 335 that is around the coil 330. For convenience, and not by way of limitation, FIG. 3 depicts the inductive proximity region 335 as having an area and boundaries, but it is to be understood that an inductive proximity region of an electrical conductor may have a region (e.g., volume, shape, sensitivity) that is influenced by physical and electrical characteristics of the conductor.

Based on the proximity of the conductor 325 to the coil 330—e.g., within the inductive proximity region 335—an electrical current carried via the conductor 325 may induce a sense voltage within the coil 330. The sense voltage may be based on one or more of a strength of the current in the conductor 325, a distance between the conductor 325 and the coil 330 within the inductive proximity region 335, a presence of insulating materials between the conductor 325 and the coil 330, or other suitable factors that may modify induction of the sense voltage. In some cases, the current sense system 300 may be physically arranged to maximize induction of the sense voltage in the coil 330. For example, the conductor 325 may be placed in a location that minimizes a distance between the conductor 325 and the coil 330. In addition, the conductor 325 may include a sensing loop that encircles (or partially encircles) the relay 320 or the coil 330, within inductive proximity to the coil 330. In some cases, the sensing loop may be looped in a particular direction around the relay 320, such that multiple portions of the conductor 325 (e.g., carrying current in the particular direction) are located within the inductive proximity region 335. In some cases, the current sense system 300 may include additional physical arrangements to improve induction of the sense voltage, such as minimizing insulating material between the coil 330 and the conductor 325.

In some cases, the integrator 370 may receive the sense voltage that is induced in the coil 330, via the coil output 334 and the integrator input 372. In addition, the integrator 370 may receive a reference voltage from the coil 330, via the coil input 332 and the integrator input 376. FIG. 3 depicts the integrator 370 as receiving the reference voltage via the coil input 332, but other implementations are possible, such as a reference voltage that is received via a connection to a digital ground. In some cases, the integrator 370 may be configured to provide a load sense signal via the integrator output 374. The load sense signal may be based on a comparison of the sense voltage and reference voltage received via the integrator inputs 372 and 376. In some cases, the integrator 370 may provide the load sense signal to one or more additional components of the current sense system 300, such as to the current indication module 360 via the load sense input 362.

In some implementations, additional components of the current sense system 300 may be arranged within or beyond the inductive proximity region 335. For example, an electrical conductor that provides the reference voltage to the integrator 370, such as a conductor between the coil input 332 and the integrator input 376, may be arranged outside of the inductive proximity region 335. The conductor that provides the reference voltage may also be arranged outside of one or more additional inductive proximity regions of the conductors 323 or 325. In addition, the latch 340 may be located within inductive proximity of the coil 330, such that the latch 340 may be opened or closed based on an activation signal of the coil 330.

Figure 4:
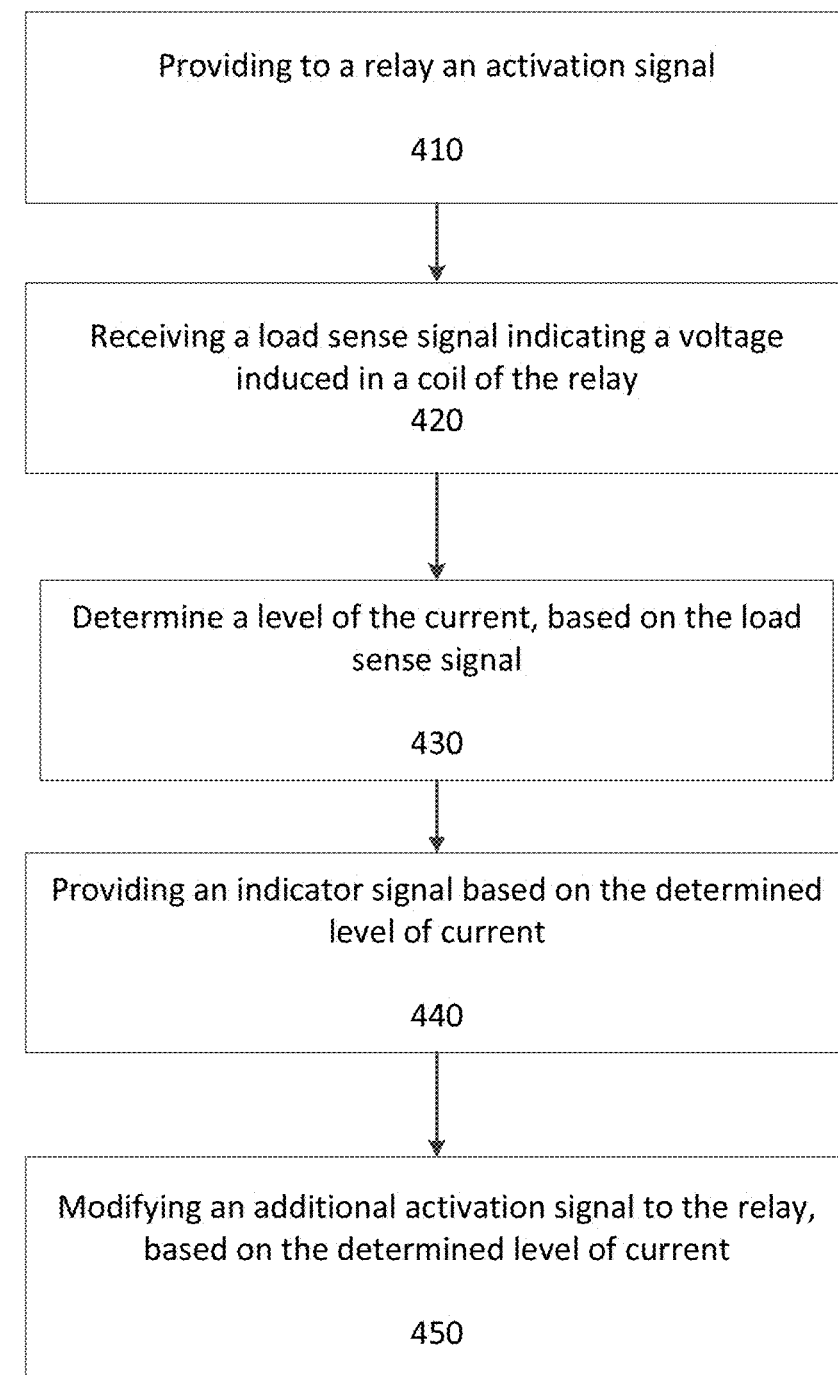
FIG. 4 is a flow chart depicting an example of a process for identifying a level of an electrical characteristic via a current sense system, according to certain implementations.

FIG. 4 is a flow chart depicting an example of a process 400 for identifying a level of an electrical characteristic. In some implementations, such as described in regards to FIGS. 1-3, a microcontroller or other computing device included in (or otherwise in communication with) a system for sensing electrical characteristics, such as a current sense system, implements operations described in FIG. 4, by executing suitable program code. For illustrative purposes, the process 400 is described with reference to the examples depicted in FIGS. 1-3. Other implementations, however, are possible.

At block 410, the process 400 involves providing one or more activation signals to at least one relay that is included in a current sense system. Responsive to the activation signal, a coil of the relay may activate a latch of the relay, such as by transitioning the latch between an open state and a closed state. For example, the relay controller 250 may provide an activation signal to the relay 220. Responsive to the activation signal, the coil 230 may activate the latch 240. In some cases, the relay may be a latching relay. In addition, the activation signal may close the latch of the relay, such that electrical current is provided from an AC power source to an electrical load via the relay latch and one or more conductors connected to the relay latch. For example, while the latch 240 is closed, current may be provided from the AC power source 210 to the electrical load 290. In some implementations, one or more operations related to block 410 may be optional.

At block 420, the process 400 involves receiving a load sense signal indicating a voltage induced in the coil of the relay. The load sense signal may be based on one or more electrical signals received from the relay coil, such as a sense voltage from an output of the coil or a reference voltage from an input of the coil. In some cases, the voltage may be induced by a current (or other electrical signal)

carried via a load conductor that is in inductive proximity to the relay coil. In some cases, the load conductor is connected to the relay latch. The current may be provided to an electrical load that is connected to the relay latch via the load conductor. For example, a sense voltage in the coil 330 may be induced by a current that is carried via the load conductor 325 that is within the inductive proximity region 335 of the coil 330.

In some cases, the load sense signal may be received from the relay coil. In addition, the load sense signal may be received from one or more additional components of the current sense system, such as an integrator. For example, the integrator 370 may provide a load sense signal indicating a sense voltage induced in the coil 330. The integrator 370 may generate the load sense signal based on a reference voltage received from the coil input 332 and on a sense voltage received from the coil output 334. In some cases, the load sense signal may be received via a load sense input, such as a load sense input of a microcontroller or a current indication module.

At block 430, the process 400 involves determining a level of current (or other electrical characteristic) based on the load sense signal. In some cases, the determined current level describes current carried via the load conductor that is in inductive proximity to the relay coil. For example, the current indication module 260 may measure a level of current carried in the conductor 225 that is in inductive proximity to the coil 230, based on the load sense signal received from the integrator 270.

At block 440, the process 400 involves providing an indicator signal that is based on the determined level of current (or other electrical characteristic). For example, the indicator signal may include data (e.g., digital data, binary values, analog signals) that describes the determined level of current. In some cases, the indicator signal may include a value of the determined level of current, such as a numeric value describing amperage of the current. In addition, the indicator signal may include additional values describing the current, such as a numeric value indicating whether the current has exceeded or fallen below a threshold level of current. For example, the current indication module 260 may provide an indicator signal describing the level of current carried in the conductor 225.

In some cases, the indicator signal may be provided to one or more additional components of the current sense system or to one or more devices in addition to the current sense system. As a non-limiting example, the indicator signal may be provided to one or more of a relay controller included in the current sense system; the electrical load that receives power via the current sense system; a component of the AC power source that provides power to the electrical load; an electrical management system (e.g., determining efficient operation of one or more electrical loads); a building security system that monitors one or more safety systems or security systems (e.g., fire suppression, security cameras, keycard access); or any other suitable component or device that may use data describing an electrical load.

At block 450, the process 400 involves modifying an additional activation signal to the at least one relay included in the current sense system. The additional activation signal may be modified based on one or more of the determined level of current or the indicator signal. For example, the relay controller 250 may provide an additional activation signal to the relay 220 based on an indicator signal received from the current indication module 260. In some implementations, one or more operations related to block 450 may be optional.

In some implementations, one or more operations related to one or more of blocks 410 or 450 may be implemented during an activation state of the current sense system. In addition, one or more operations related to one or more of blocks 420, 430, or 440 may be implemented during an operational state of the current sense system. In some cases, operations implemented during the operational state are implemented subsequent to the activation state, such as following the completion of a stabilization period. For example, subsequent to an activation signal provided in relation to block 410, the process 400 may pause (or otherwise delay) operations for an amount of time during the stabilization period, during which one or more electrical signals in the current sense system may stabilize (e.g., reach steady-state). During one or more of the activation state or the stabilization period, the current sense system may indicate that load sense information is not available.

In some implementations, one or more operations related to the process 400 may be performed by one or more components of a current sense system. For example, a first microcontroller (or logical component of a microcontroller) could perform one or more operations related to generating an activation signal, such as in relation to one or more of blocks 410 or 450. In addition, a second microcontroller (or logical component microcontroller) could perform one or more operations related to generating an indicator signal, such as in relation to blocks 420, 430, or 440. In some cases, one or more operations related to the process 400 may be performed by additional components of the current sense system, such as a transistor (e.g., BJT, FET) that is external to a microcontroller. For example, the transistor could be configured to provide an activation signal, such as in relation to one or more of blocks 410 or 450.

Figure 5:
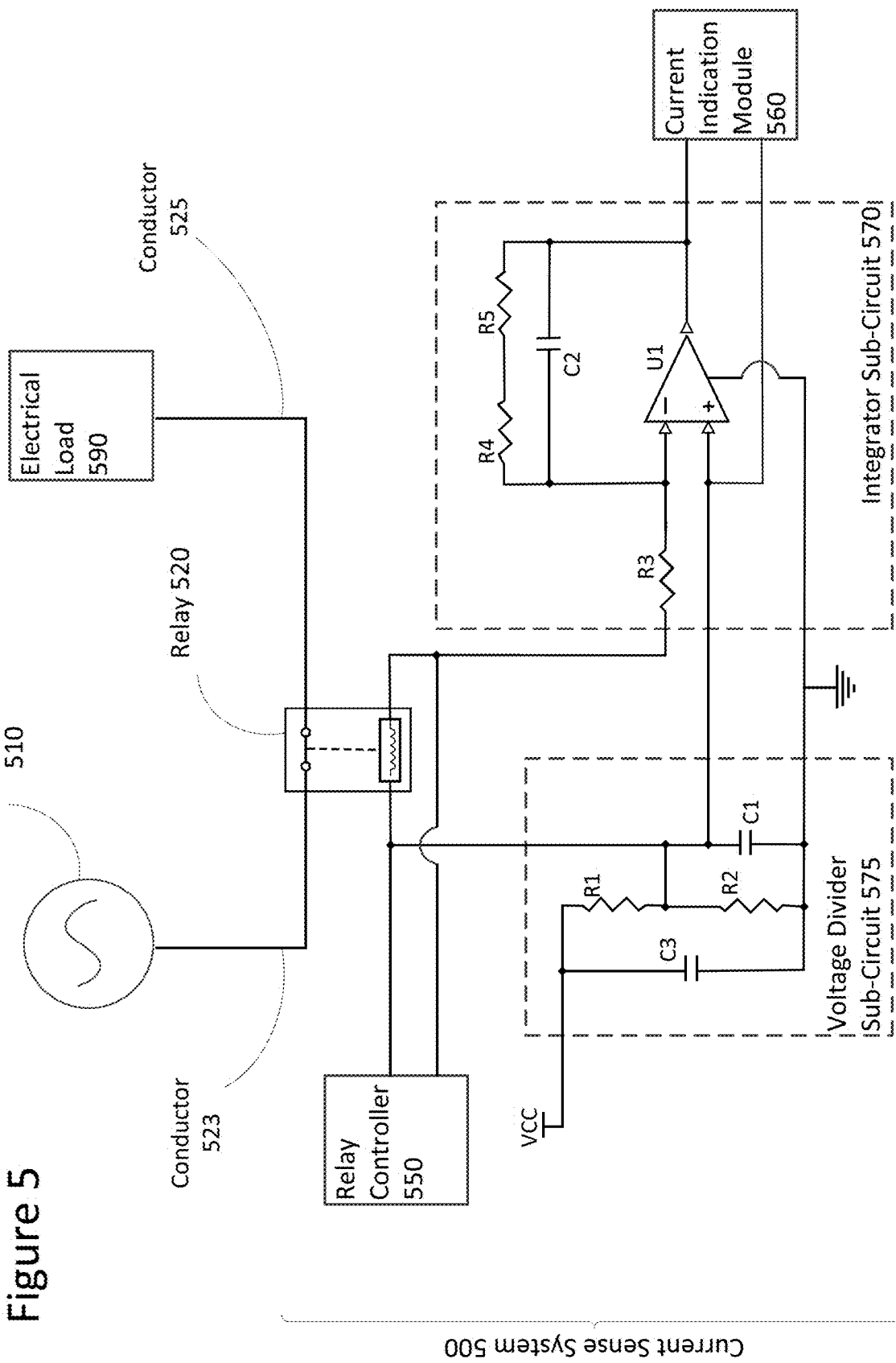
FIG. 5 is a diagram depicting an example configuration of electrical components that may be used to generate a load sense signal indicating an electrical characteristic, according to certain implementations.

In some implementations, a system for sensing electrical characteristics, such as a current sense system, includes one or more electrical components that are configured to generate a load sense signal. FIG. 5 is a diagram depicting an example configuration of electrical components that may be used to generate a load sense signal. In FIG. 5, a current sense system 500 may include one or more of a relay 520, a relay controller 550, or a current indication module 560. In some cases, a particular component of the current sense system 500, such as a microcontroller, may implement one or more of the relay controller 550 or the current indication module 560. In addition, the current sense system 500 may include one or more additional electrical components configured in circuits or sub-circuits, such as electrical components configured as a voltage divider sub-circuit 575 or electrical components configured as an integrator sub-circuit 570.

In some implementations, a power source 510 (such as an AC power source) and an electrical load 590 may be electrically connected via the relay 520, a first load conductor 523, and a second load conductor 525. For example, the power source 510 may be electrically connected to a latch of the relay 520 via the conductor 523. In addition, the electrical load 590 may be electrically connected to the latch of the relay 520 via the conductor 525. In some cases, one or more of the conductors 523 or 525 may be arranged to be within inductive proximity of coil of the relay 520, such that current (or other electrical characteristics) transmitted via the conductor 523 or 525 induces a sense voltage (or other electrical characteristic) in the coil of the relay 520.

In the current sense system 500, the voltage divider sub-circuit 575 may include one or more of a resistor R1, a resistor R2, a capacitor C1, or a capacitor C3. The resistor R1 may be connected between an electrical source, such as a source Vcc, and a common point with the resistor R2. The electrical source may provide a stable (or mostly stable) digital voltage, such as about 5 V, about 3.3 V, or another voltage suitable for digital electronics components. The resistor R2 may be connected to the common point with the resistor R1 and to an additional electrical connection, such as a connection to electrical ground. In addition, the capacitor C3 may be connected between the electrical source and electrical ground. The capacitor C1 may be connected between the common point of the resistors R1 and R2 and electrical ground. In some cases, the resistor R1 may have a value of about 3 kΩ, the resistor R2 may have a value of about 3 kΩ, the capacitor C1 may have a value of about 100 nF, and the capacitor C3 may have a value of about 100 nF. In some implementations, component values in a voltage divider sub-circuit of a current sense system may be adjusted, such as based on the characteristics of a relay included in the current sense system or electrical signals received by the current sense system. FIG. 5 depicts the current sense system 500 as including the voltage divider sub-circuit 575, but other implementations are possible. For example, a current sense system that omits a voltage divider sub-circuit may include one or more of an integrator sub-circuit or a current indication module that receive a reference voltage from a digital ground.

In some implementations, the relay controller 550 may be connected to an input to the coil of the relay 520. In addition, the coil of the relay 520 may be connected to the common point between the resistors R1 and R2. In some implementations, the resistor R1 of the resistor R2 may be arranged as a voltage divider for a reference voltage for the integrator sub-circuit 570. For example, the common point between the resistors R1 and R2 may be connected to the integrator sub-circuit 570, such as to a reference input of a comparator component in the integrator sub-circuit 570. In some cases, the reference input may provide a level-shift function for integrator the comparator component in the integrator sub-circuit 570.

In the current sense system 500, the integrator sub-circuit 570 may include one or more of an operational amplifier ("op-amp") U1, a resistor R3, a resistor R4, a resistor R5, or a capacitor C2. The op-amp U1 may have a reference input, an inverting input, and an output. In addition, the op-amp U1 may have one or more of a power connection or a connection to electrical ground. In some implementations, the output of the op-amp U1 may be connected to a first input of the current indication module 560. In addition, the reference input of the op-amp U1 may be connected to a second input of the current indication module 560.

In the integrator sub-circuit 570, the resistor R3 may be connected between an output of the coil in relay 520 and the inverting input of the op-amp U1. In some cases, the output of the coil in relay 520 may also be connected to the relay controller 550. The capacitor C2 may be connected between the inverting input and the output of the op-amp U1. The resistors R4 and R5 may be connected in series. In addition, the series resistors R4 and R5 may be connected between the inverting input and the output of the op-amp U1. FIG. 5 depicts the integrator sub-circuit 570 as including the series resistors R4 and R5, but other implementations are possible, such as a current sense system that omits resistors between the inverting input and the output of an op-amp of an integrator sub-circuit. In some implementations, the arrangement of the op-amp U1, the resistor R3, and the capacitor C2 may be configured to provide an integrator that is capable of providing an output signal based on signals received via the reference input and the inverting input. In addition, the series resistors R4 and R5 may be configured to prevent a voltage drift of the output signal from the op-amp U1. In some cases, the resistor R3 may have a value of about 100 kΩ, the resistor R4 may have a value of about 4 MΩ, the resistor R5 may have a value of about 7 MΩ, and the capacitor C2 may have a value of about 15 nF. In some implementations, component values in an integrator sub-circuit of a current sense system may be adjusted, such as based on characteristics of a relay included in the current sense system or electrical signals received by the current sense system. For example, component values of one or more of R3 or C2 may be adjusted based on inductance of the coil of the relay 520 or switching characteristics of a dimmer in the electrical load 590.

FIG. 5 depicts the current sense system 500 as including the integrator sub-circuit 570, but other implementations are possible. For example, a current sense system that omits an integrator sub-circuit may include a current indication module that provides one or more of a load sense signal or an indicator signal based on a sense voltage and a reference voltage that are received by the example current indication module.

In some implementations, a voltage that is present at the common point between the resistors R1 and R2 may be received by one or more of the coil of the relay 520, the reference input of the op-amp U1, or the second input of the current indication module 560. For example, during an activation state of the current sense system 500, a control signal provided by the relay controller 550 (e.g., a digital pulse, an activation voltage) may be received by the coil input of the relay 520. In some cases, during the activation state, one or more of the integrator sub-circuit 570 or the current indication module 560 may indicate that load sense information (e.g., for the electrical load 590) is not available. For example, the current indication module 560 may determine, based on a voltage level of the control signal received via the second input of the current indication module 560, that the current sense system 500 is operating in the activation state.

During a sensing state of the current sense system 500, a sense voltage may be induced in the coil of the relay 520, such as a sense voltage based on a current carried by one or more of the load conductors 523 or 525. In some cases, the sense voltage induced in the coil may be received by the inverting input of the op-amp U1. In addition, during the sensing state, a reference voltage that is present at the input of the coil of the relay 520 (such as via the common point between R1 and R2) may be received by one or more of the reference input of the op-amp U1 or the second input of the current indication module 560. During the sensing state, the op-amp U1 may provide a load sense signal that is based on a comparison of the sense voltage and the reference voltage, e.g., a comparison between signals present on the reference input and the inverting input. In addition, the op-amp U1 may provide the load sense signal to the first input of the current indication module 560. In some cases, the current indication module 560 may generate an indicator signal based on the load sense signal. In addition, the current indication module 560 may provide the indicator signal to one or more additional components of the current sense system 500, such as to the relay controller 550.

In some cases, the current indication module 560 may generate the indicator signal based on a determination that the current sense system 500 is operating in the sensing state. For example, the current indication module 560 may determine an operational state of the system 500 based on a reference voltage received via the second input of the current indication module 560. Based on a determination that the reference voltage is below a threshold voltage level (e.g., corresponding to control signals from the relay controller 550), the current indication module 560 may determine that the system 500 is operating in the sensing state.

GENERAL CONSIDERATIONS

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more implementations of the present subject matter. Any suitable programming, scripting, or other type of language or combinations of languages may be used to implement the teachings contained herein in software to be used in programming or configuring a computing device.

Implementations of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific implementations thereof, it will be appreciated that those skilled in the art, upon attaining an understanding of the foregoing, may readily produce alterations to, variations of, and equivalents to such implementations. Accordingly, it should be understood that the present disclosure has been presented for purposes of example rather than limitation, and does not preclude inclusion of such modifications, variations, and/or additions to the present subject matter as would be readily apparent to one of ordinary skill in the art.

What is claimed is:

1. A current sensing system comprising:
   a relay that includes (i) a coil and (ii) a latch that is capable of connecting to a power source via an input of the latch and to an electrical load via an output of the latch, wherein the latch is configured to provide a current to the electrical load from the power source;
   a load conductor that is connected to the output of the latch and a power input of the electrical load, wherein the current provided by the latch is carried via the load conductor,
   wherein the load conductor is located in proximity to the coil, such that the current carried via the load conductor induces a sense voltage in the coil; and
   an integrator sub-circuit that has a first connection to an output of the coil and a second connection to an input of the coil,
   wherein the coil is configured for an activation state, in which, responsive to an activation signal received by the coil, the latch transitions between an open state and a closed state,
   wherein the coil is further configured for a sensing state, in which the latch is closed and in which the current is provided to the electrical load via the latch and via the load conductor,
   wherein during the sensing state, the integrator sub-circuit provides a load sense signal based on a comparison of (i) the sense voltage received via the first connection of the integrator sub-circuit and (ii) a reference voltage received via the second connection of the integrator sub-circuit.

2. The current sensing system of claim 1, wherein the integrator sub-circuit includes an operational amplifier ("op-amp"), the op-amp being configured to receive the sense voltage via an inverting input and to receive the reference voltage via a reference input.

3. The current sensing system of claim 1, wherein during the activation state of the coil, the integrator sub-circuit modifies the load sense signal to indicate that load sense information is not available.

4. The current sensing system of claim 1, further comprising an analog-to-digital convertor, wherein the analog-to-digital convertor provides a digital load sense signal that is based on the load sense signal.

5. The current sensing system of claim 1, further comprising a microcontroller, wherein the microcontroller is configured to determine, based on the load sense signal, a level of the current provided to the electrical load.

6. The current sensing system of claim 5, wherein the microcontroller is further configured to provide an indicator signal based on the determined level of the current provided to the electrical load.

7. The current sensing system of claim 1, further comprising a voltage divider sub-circuit, wherein the reference voltage is provided to the input of the coil via an output of the voltage divider sub-circuit.

8. The current sensing system of claim 1, wherein the load conductor includes a sensing loop that is arranged to encircle the relay in proximity to the coil.

9. A current sense system comprising:
   a relay that includes (i) a coil and (ii) a latch that is capable of connecting to a power source via an input of the latch and to an electrical load via an output of the latch, wherein the latch is configured to provide a current to the electrical load from the power source;
   a load conductor that is connected to the latch and located in proximity to the coil, such that a current provided by the latch is carried via the load conductor, wherein the current carried via the load conductor induces a sense voltage in the coil; and a current indication module having a load sense input that is connected to an output of the coil, wherein during an activation state, the relay activates the latch responsive to an activation signal received by the coil, such that the latch transitions between an open state and a closed state, wherein during a sensing state, the current indication module:
  i) receives, via the load sense input, a load sense signal based on the sense voltage induced in the coil, and
  ii) determines, based on the load sense signal, a level of the current received by the electrical load.

10. The current sense system of claim 9, wherein the load conductor is connected to the latch via the input of the latch, wherein the load conductor is connected to the power source and the input of the latch.

11. The current sense system of claim 9, wherein the load conductor is connected to the latch via the output of the latch, wherein the load conductor is connected to the electrical load and the output of the latch.

12. The current sense system of claim 9, further comprising an integrator sub-circuit having a first connection to an output of the coil and a second connection to an input of the coil, wherein the load sense signal is based on a comparison of
  (i) the sense voltage received via the first connection of the integrator sub-circuit and (ii) a reference voltage received via the second connection of the integrator sub-circuit, wherein the current indication module receives the load sense signal via an output of the integrator sub-circuit.

13. The current sense system of claim 12, wherein during the activation state:

the integrator sub-circuit modifies the load sense signal to indicate that load sense information is not available; and the current indication module:
  i) receives the modified load sense signal via the output of the integrator sub-circuit, and
  ii) responsive to receiving the modified load sense signal, modifies an indicator signal indicating the determined level of the current received by the electrical load.

14. The current sense system of claim 12, further comprising a voltage divider sub-circuit, wherein the reference voltage is provided to the input of the coil via an output of the voltage divider sub-circuit.

15. The current sense system of claim 9, further comprising an analog-to-digital convertor, wherein the analog-to-digital convertor provides a digital load sense signal that is based on the load sense signal.

16. The current sense system of claim 15, wherein the analog-to-digital convertor is included in the current indication module, such that the load sense signal is provided to the analog-to-digital convertor via the load sense input.

17. The current sense system of claim 9, wherein during the activation state, the activation signal received by the coil is provided by the current indication module.

18. The current sense system of claim 9, wherein the current indication module is configured to, responsive to the determined level of the current received by the electrical load, provide an additional activation signal to the relay, wherein, responsive to the additional activation signal, the relay activates the latch such that the latch transitions from the closed state to the open state.

19. A method of sensing current, the method comprising:

receiving, via a load sense input, a load sense signal indicating a sense voltage induced in a coil included in a relay, wherein the sense voltage is induced by a current carried via a load conductor connected to a latch included in the relay, the current provided to an electrical load via the load conductor;

determining, based on the load sense signal, a level of the current provided to the electrical load; and providing an indicator signal based on the determined level of the current provided to the electrical load.

20. The method of claim 19, further comprising providing, to the coil of the relay, an activation signal causing the relay to activate the latch, such that the latch transitions between an open state and a closed state.

* * * * *